United States Patent [19]
Wilson et al.

[11] Patent Number: 5,963,160
[45] Date of Patent: Oct. 5, 1999

[54] ANALOG TO DIGITAL CONVERSION USING NONUNIFORM SAMPLE RATES

[75] Inventors: James Wilson, Sharon; Ronald A. Cellini, Newton; James M. Sobol, Norfolk, all of Mass.

[73] Assignee: Analog Devices, Inc., Norwood, Mass.

[21] Appl. No.: 08/612,942

[22] PCT Filed: Sep. 13, 1994

[86] PCT No.: PCT/US94/10268

§ 371 Date: Aug. 29, 1996

§ 102(e) Date: Aug. 29, 1996

[87] PCT Pub. No.: WO95/08220

PCT Pub. Date: Mar. 23, 1995

Related U.S. Application Data

[63] Continuation-in-part of application No. 08/121,104, Sep. 13, 1993, abandoned.

[51] Int. Cl.[6] ................................................ H03M 3/00
[52] U.S. Cl. ............................. 341/143; 341/61; 341/155
[58] Field of Search .................................... 341/143, 144, 341/61, 155; 364/724.1

[56] References Cited

U.S. PATENT DOCUMENTS

| | | | |
|---|---|---|---|
| 4,179,670 | 12/1979 | Kingsbury | 331/10 |
| 4,281,318 | 7/1981 | Candy et al. | 341/61 |
| 4,797,845 | 1/1989 | Stikvoort | 364/724.1 |
| 4,901,077 | 2/1990 | Christopher | 341/143 |
| 4,953,117 | 8/1990 | Lagadec | 364/724.1 |
| 4,954,824 | 9/1990 | Yamada et al. | 341/61 |
| 4,987,373 | 1/1991 | Soo | 328/155 |
| 4,990,911 | 2/1991 | Fujita et al. | 341/123 |
| 5,075,679 | 12/1991 | Gazsi | 341/143 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |

(List continued on next page.)

FOREIGN PATENT DOCUMENTS

| | | | |
|---|---|---|---|
| A-0 227 172 | 7/1987 | European Pat. Off. | H03H 17/06 |
| A-0227172 | 7/1987 | European Pat. Off. | H03H 17/06 |
| A-0 512 619 | 11/1992 | European Pat. Off. | H03H 17/06 |

(List continued on next page.)

OTHER PUBLICATIONS

International Search Report from International Application PCT/US94/10268, filed Sep. 13, 1994.
International Search Report from International Application PCT/US94/10269, filed Sep. 13, 1994.

(List continued on next page.)

*Primary Examiner*—Howard L. Williams
*Assistant Examiner*—Peguy Jean Pierre
*Attorney, Agent, or Firm*—Wolf, Greenfield & Sacks, P.C.; James H. Morris

[57] ABSTRACT

A method and apparatus for analog to digital conversion using sigma-delta modulation of the temporal spacing between digital samples. The method and apparatus of the present invention provides for sigma-delta modulation of the time base such that errors produced by nonuniform sampling are frequency-shaped to a region (i.e., shifted to higher frequencies) where they can be removed by conventional filtering techniques. In one embodiment, digital data is interpolated under control of a sigma-delta modulated frequency selection signal that represents, on average, the data rate of the digital data to be output by the converter and then decimated by a fixed ratio. In another embodiment, the digital data is interpolated by a fixed ratio and then decimated under control of a sigma-delta modulated frequency selection signal that represents, on average, the data rate of the digital data to be output by the converter. The frequency selection signal is modulated using an n-th order m-bit sigma-delta modulator. Data thus emerges from the interpolation/decimation process at the sample rate selected by the n-th order m-bit sigma-delta modulator. The method and apparatus converts the data rate of an incoming digital data stream from an ADC to the data rate determined by the n-th order m-bit sigma-delta modulator.

22 Claims, 11 Drawing Sheets

U.S. PATENT DOCUMENTS

| | | | |
|---|---|---|---|
| 5,157,395 | 10/1992 | Del Signore et al. | 341/143 |
| 5,204,827 | 4/1993 | Fujita et al. | 364/724.1 |
| 5,227,787 | 7/1993 | Kurashina | 341/61 |
| 5,313,205 | 5/1994 | Wilson | 341/144 |
| 5,353,026 | 10/1994 | Wilson | 341/143 |
| 5,485,152 | 1/1996 | Wilson et al. | 341/143 |
| 5,489,903 | 2/1996 | Wilson et al. | 341/144 |
| 5,712,635 | 1/1998 | Wilson et al. | 341/144 |

FOREIGN PATENT DOCUMENTS

| | | | |
|---|---|---|---|
| 4-192711 | 7/1992 | Japan | H03H 17/02 |
| 2250875 | 6/1992 | United Kingdom | H03M 3/00 |
| WO-94 08395 | 4/1994 | WIPO | H03H 17/06 |
| WO-A-95 08200 | 3/1995 | WIPO | H03H 17/06 |
| WO-A-95 08221 | 3/1995 | WIPO | H03H 17/06 |

OTHER PUBLICATIONS

International Search Report from International Application PCT/US95/03739, filed Mar. 23, 1995.

J. Janssen, et al. A New Principle/IC for Audio Sampling Rate Conversion, presented at the 96th Convention, Feb. 26, 1994–Mar. 1, 1994.

Richard J. Higgins, Digital Signal Processing in VLSI, Prentice Hall, Englewood Cliffs, NJ 07632, 1990, pp. 29–31.

Douglas F. Elliot, et al. Fast Transforms, Algorithms, Analyses, Applications, 1982, Academic Press, p. 13.

Paul J. Hurst, et al, A Programmable Clock Generator Using Noise Shaping and Its Application in a Switched–Capacitor Filter, Solid State Circuits Research Laboratory, Dept. of Electrical and Computer Engineering, University of California, Davis (two pages), no date of reference available.

Electronique, No. 24, Jan. 1993, Paris, France, pp. 42–44, Trazeguet, H., "Les CAN Delta–Sigma Deviennent Programmables".

Patent Abstracts of Japan, vol. 003, No. 018 (E–091) Feb. 16, 1979 & JP–A–53147409 (Fujitsu Ltd.) Dec. 22, 1978.

IEEE Transactions On Instrumentation And Measurement, vol. 41, No. 6, Dec. 1, 1992, pp. 868–873, Park S. "Multi-stage Decimation Filter Design Technique For High–Resolution Sigma–Delta A/D Converters".

IEEE Transactions On Signal Processing, vol. 41, No. 1, Jan. 1, 1993, pp. 131–146, Sathe V.P. et al. "Effects of Multirate Systems on the Statistical Properties of Random Signals".-

ANALOG TO DIGITAL CONVERSION USING NONUNIFORM SAMPLE RATES

CROSS REFERENCE TO RELATED APPLICATIONS

This application is the U.S. National Phase of application Ser. No. PCT/US94/10268, filed Sep. 13, 1994, which in turn is a continuation-in-part of application Ser. No. 08/121,104, filed Sep. 13, 1993, abandoned, entitled ANALOG TO DIGITAL CONVERSION USING NON-UNIFORM SAMPLE RATES.

BACKGROUND OF THE INVENTION

1. Field of the Invention

The present invention relates generally to the field of methods and circuits for analog to digital conversion. More particularly, the present invention relates to a method and circuit for analog to digital signal conversion using sigma-delta modulation of the temporal spacing between digital samples.

2. Discussion of the Related Art

Analog to Digital Converter (ADC) circuits and methods for analog to digital conversion are well-known in the art. Conventional ADCs receive an analog signal and, as a function of a reference voltage, convert the analog signal into a corresponding single or multi-bit binary level digital signal.

One type of ADC that has recently become popular is the so-called sigma-delta ADC. There are many references describing sigma-delta systems. One example is entitled *Mixed-Signal Design Seminar* published by Analog Devices, Inc., 1991, which is incorporated herein by reference.

As shown in FIG. 1, a conventional sigma-delta analog to digital converter includes an analog low-pass filter 1 having a passband from zero to an upper frequency $f_a$. The analog low-pass filter typically has a stop band frequency equal to $kf_s/2$ where $f_s$ is the sample rate The analog low-pass filter implements a portion of a required anti-aliasing function for the ADC. The filtered analog signal is then transmitted to an analog to digital converter 2 that uses a sigma-delta modulator to convert the analog signal into a one-bit digital data stream and to noise shape the digital data stream. In A to D converters, the sigma-delta modulators are typically all analog. The sigma-delta modulator effectively low-pass filters the signal of interest and high-pass filters the quantization noise on the signal. The output of the sigma-delta modulator is typically a high frequency one-bit data stream. The A to D converter is typically clocked at a frequency $kf_s$ that is k times the samples rate (i.e., data rate or sampling frequency). This produces a so-called oversampled signal. The output of the sigma-delta modulator is transmitted to a digital low-pass filter 3 that implements the anti-aliasing function with respect to $f_s$ and has sufficient stop band attenuation at $f_s/2$ to achieve the desired dynamic range. The digital low-pass filter removes the shaped quantization noise that resides in the upper frequency area. The output of the digital low-pass filter is transmitted to a decimator 4 that provides a data rate reduction to $f_s$ by digitally resampling the output of the digital low-pass filter. Decimation can also be viewed as the method by which the redundant information introduced by the oversampling process is removed.

One of the limitations of conventional ADCs including the sigma-delta ADC illustrated in FIG. 1 is that they only determine the magnitude of the input signal at equally spaced temporal intervals. This is known as uniform sampling. Additionally, in conventional ADCs, the sample rate, that is, the data rate $f_s$, of the digital data stream cannot be independent of the master clock that is used to clock the ADC. The digital data rate $f_s$ must be some integer division of the master clock. This means that if two different output data rates were required, for example, that are not necessarily divisible into the master clock, there must be two different frequency master clocks available for clocking the ADC.

Another problem with conventional ADCs is that they are typically not designed to be clocked by an externally supplied clock signal. The components of the ADC are typically optimized to operate at the clock frequency determined by the master clock on the ADC chip. This leads to the additional limitation that some ADCs cannot lock to and operate at some externally supplied clock signal. Therefore, if the digital data stream is supplied to some other external component that is clocked by another clock signal, since the outgoing digital data stream and the other clock signal are not necessarily related to each other (or to the master clock on the ADC), any temporal changes in the relationship between the data rate and the other clock can disrupt the entire analog to digital conversion process.

Therefore, an object of the present invention is to provide a method and apparatus for performing analog to digital conversion using nonuniform sampling (i.e., variable temporal spacing of the sampling points).

Another object of the present invention is to provide a method and apparatus for performing analog to digital conversion that can lock to an externally supplied clock signal and can provide an output signal at a sampling rate that is independent of the ADC master clock.

SUMMARY OF THE INVENTION

The present invention overcomes the limitations of the prior art by providing a method and apparatus for analog to digital conversion using nonuniform sampling. In one embodiment of the invention, the apparatus includes an analog to digital converter for converting an analog signal to a digital signal at a first data rate. An interpolator or other comparable circuitry such as a sample and hold circuit is coupled to the analog to digital converter and receives the digital signals at the first data rate and supplies the digital signals at an increased data rate. A decimator is coupled to the interpolator and decimates the digital signals at the increased data rate to provide digital signals at a second data rate. In one embodiment, a sigma-delta modulator is coupled to and controls the interpolator and provides a sigma-delta modulated output signal representative of the second data rate to control the interpolator to provide the digital signals at the increased data rate so that, upon decimation by the decimator, the digital signals are at the second data rate. This embodiment of the invention interpolates the digital data by a variable ratio depending on the second data rate desired and then decimates the interpolated digital data by a fixed ratio.

In another embodiment of the invention, the apparatus includes an analog to digital converter for converting an analog signal to a digital signal at a first data rate. An interpolator or other comparable circuitry such as a sample and hold circuit is coupled to the analog to digital converter and receives the digital signal at the first data rate and supplies the digital signals at an increased data rate. A decimator is coupled to the interpolator and decimates the digital signal at the increased data rate to provide digital signals at a second data rate. A sigma-delta modulator is coupled to and controls the decimator and provides a sigma-delta modulated output signal representative of the second data rate and controls the decimator to provide the digital signals at the second data rate. The sigma-delta modulator may also control a clock randomizer/suppressor circuit that in turn controls the decimator to avoid unwanted tones in the output digital signal. This embodiment of the invention interpolates the digital data by a fixed ratio and then decimates the interpolated digital data by a variable ratio depending on the second data rate desired.

In another embodiment of the invention, a phase locked loop (PLL) which may be a digital or analog PLL is provided for receiving a signal representative of the second data rate, locking to the signal, and providing a control signal to the sigma-delta modulator that controls the sigma-delta modulator to provide the sigma-delta modulated output signal. The sigma-delta modulator forms part of the digitally controlled oscillator in the PLL. The phase locked loop allows the circuit to lock to and track any externally-supplied clock signal.

Broadly stated, the method of the present invention includes sigma-delta modulation of the time base such that errors produced by nonumiform sampling are frequency-shaped to a region (i.e., shifted to higher frequencies) where they can be removed by conventional filtering techniques. That is, the method of the present invention provides a temporally noise-shaped digital signal.

In one embodiment of the invention, the method is to perform a variable interpolation (or other method to increase the sample rate of the digital data stream) and filtering to remove images followed by a fixed decimation with the interpolation controlled by a sigma-delta modulator that is fed a frequency selection number representing the desired output sample rate. Variable interpolation means that the interpolation ratio is varied as a function of the desired output sample rate. Fixed decimation means that the decimation ratio is the same regardless of the sample rate. A digital data stream output by an analog to digital converter (ADC) at a first data rate is interpolated to a higher data rate using a control signal that is a sigma-delta modulated signal that represents the desired output data rate (or sample rate). The frequency selection signal is modulated using an n-th order m-bit sigma-delta modulator. This control signal (the sigma-delta modulated frequency selection signal output by the sigma-delta modulator) represents, on average, the sample rate of the digital data to be output by the converter. The control signal controls the interpolator to increase the data rate such that, upon fixed decimation, data emerges from the interpolation/decimation process at the desired output sample rate.

In another embodiment of the invention, the method is to perform a fixed interpolation (or other method to increase the sample rate of the digital data stream) and filtering to remove images followed by a variable decimation with the decimation controlled by a sigma-delta modulator that is fed a frequency selection number representing the desired sample rate of the output digital data stream. Fixed interpolation means that the interpolation ratio is the same regardless of the sample rate. Variable decimation means that the decimation ratio is varied as a function of the desired output sample rate. A digital data stream output by an analog to digital converter (ADC) at a data rate is interpolated to a higher data rate. This higher data rate digital data stream is then decimated using a control signal that is a sigma-delta modulated signal that represents the desired output data rate (or sample rate). The frequency selection signal is modulated using an n-th order m-bit sigma-delta modulator. This control signal (the sigma-delta modulated frequency selection signal output by the sigma-delta modulator) represents, on average, the sample rate of the digital data to be output by the converter. Data thus emerges from the interpolation/decimation process at the desired output sample rate.

The method thus converts the data rate of the digital data stream output by the analog to digital converter from an oversampled signal to a digital data stream having the desired sample rate.

The features and advantages of the present invention will be more readily understood and apparent from the following detailed description of the invention, which should be read in conjunction with the accompanying drawings, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to specific data rates, interpolation (or more generally sample rate increase) ratios, decimation ratios, and clock frequencies of operation. One skilled in the art will recognize that the present invention is not limited to the specific embodiments disclosed, and can be more generally applied to other circuits and methods having different operating parameters than those illustrated.

Figure 1:
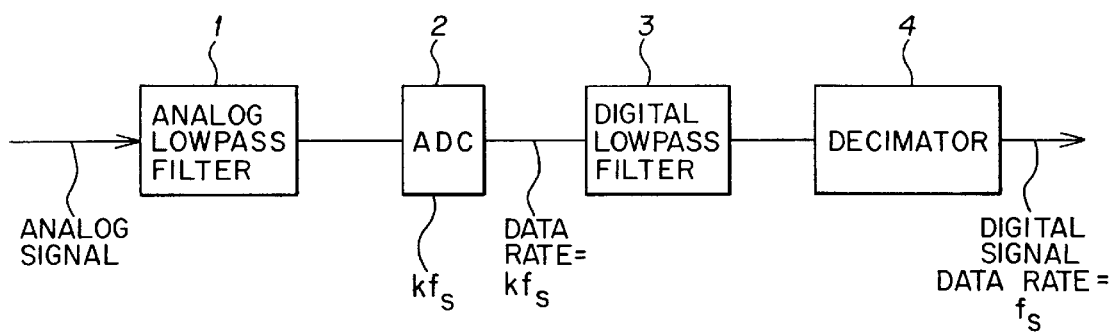
FIG. 1 is a block diagram of a conventional sigma-delta analog to digital converter (ADC)
Figure 2:
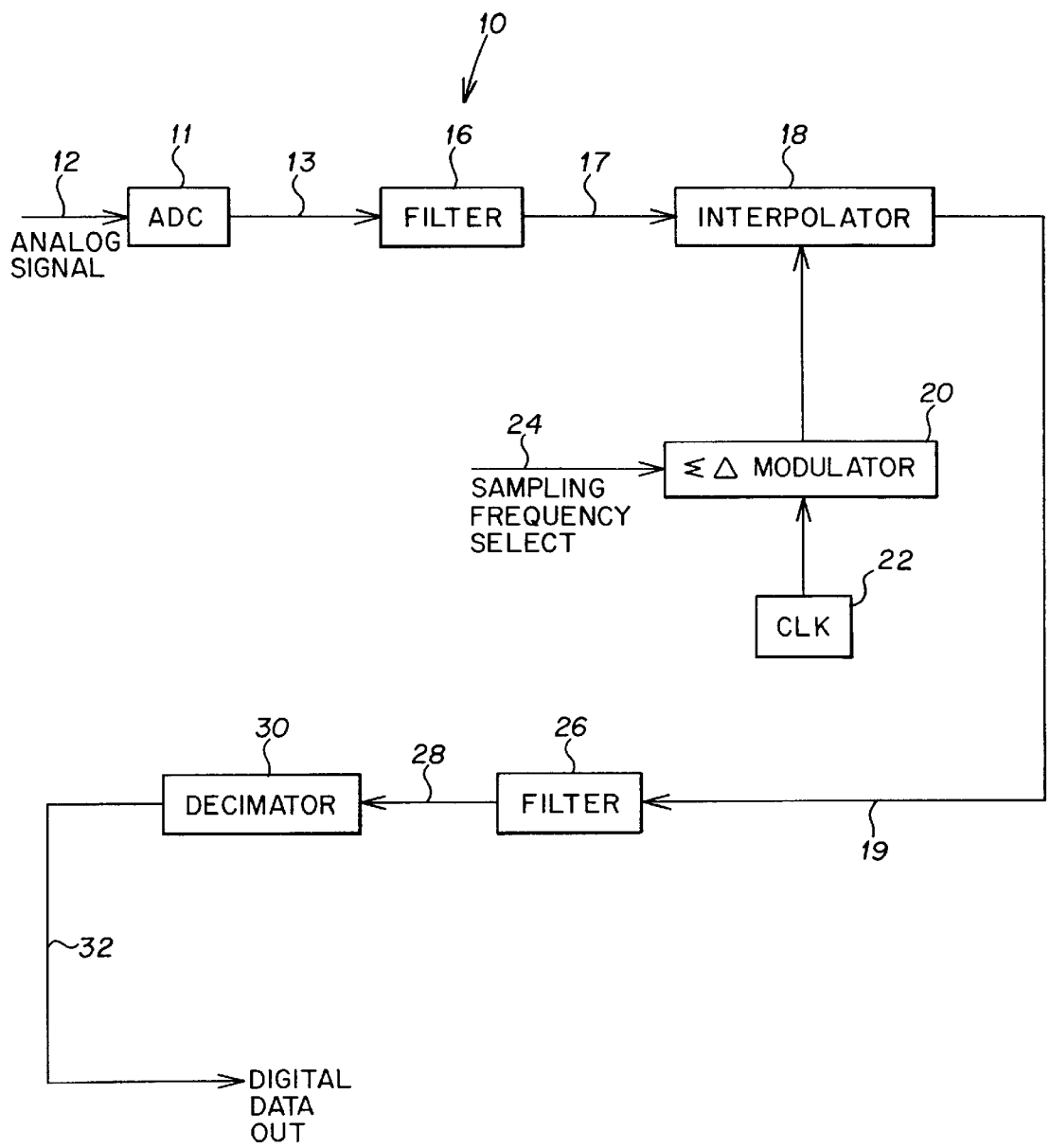
FIG. 2 is a block diagram of a general ADC circuit incorporating a first embodiment of the invention.

FIG. 2 is a block diagram broadly illustrating a first embodiment of the invention. The overall purpose of circuit 10 is to receive an analog signal on line 12 at any frequency within a predetermined working range of the system, convert this signal to a digital data stream, increase the sample rate of the digital data stream and then decimate this higher rate digital data stream so that the data presented on line 32 is at a desired sampling rate. The first embodiment uses variable interpolation followed by fixed decimation. In other words, circuit 10 receives, from analog to digital converter 11, digital data at a fixed, predetermined data rate and converts this data to a digital data stream at another data rate. The other data rate may or may not be the same as the data rate output by analog to digital converter 11 and may be at a fixed or variable rate. The digital data stream on line 13 output by analog to digital converter 11 may be of any width. ADC 11 may be any well-known type of analog to digital converter.

In the circuit illustrated in FIG. 2, the analog signal on line 12 is converted to a digital data stream on line 13 by ADC 11. The digital data stream on line 13 typically has a constant sample rate. The constant sample rate digital data stream on line 13 is filtered by low pass filter 16 to remove out of band noise that results from the analog to digital conversion process. The filtered digital data stream on line 17 is then sent to interpolator 18. Interpolator 18 increases the sample rate of the digital data stream (that is, converts the digital data stream into a higher sample rate digital data stream) on line 17 by using a sample and hold technique that repeats the digital sample for a specified number of clock cycles in a manner well-known to those skilled in the art. One skilled in the art will appreciate that other techniques may be used for increasing the sample rate of the data stream on line 17, such as interpolation techniques that insert zeroes between data samples. The purpose of interpolator 18 is to increase the sample rate of the digital data stream on line 17 to create a so-called oversampled signal. It is to be appreciated that analog to digital converter 11 may be an oversampling type converter itself, thus reducing the ratio by which interpolator 18 must increase the sample rate. However, ADC 11 may be any type of analog to digital converter whose output sample rate is then increased by interpolator 18.

The interpolation ratio (i.e., the ratio by which the sample rate of the digital data on line 17 is increased by interpolator 18 is controlled by a sigma-delta modulator 20.

A higher sample rate digital data stream on line 19 is then sent to a digital filter 26 which removes any images of the original digital signal as a result of the interpolation process. The filtered digital data stream on line 28 is then sent to a decimation block 30 that decimates the digital data stream on line 28 by a fixed decimation ratio to produce the digital data stream on line 32 having a sample rate selected by a sampling frequency select signal 24. Although filter 26 and decimation block 30 have been illustrated as separate circuit elements for illustrative purposes, one skilled in the art will appreciate that these functions may be performed by a single computation element, such as an FIR or IIR filter in a well known manner.

The sigma-delta modulator 20 produces digital data at the frequency of clock 22, the data controlling the interpolation of interpolator 18. As will be explained in more detail hereinafter, the sigma-delta modulator 20 sigma-delta modulates a signal 24 representative of the desired output sample rate of the digital data stream on line 32. An example will serve to illustrate this function. Assume that the data rate of digital data stream on line 13 is 3.072 mHz. Assume the frequency of clock 22 is 3.072 mHz. If the desired data rate of the data stream on line 32 is 48 kHz, signal 24 is therefore a multi-bit digital number representative of a sampling rate of 48 kHz where the number of bits in the digital number control the precision with which the data rate of the data stream on line 14 can be specified. This digital number is sigma-delta modulated by the sigma-delta modulator 20 and used to control interpolator 18 to increase the sample rate of the digital data stream on line 17 by a factor of six. Interpolator 18 increases this data rate to 18.432 mHz by interpolating the data by a factor of six. The resulting 18.432 mHz data is then decimated, after filtering by filter 26, by a factor of 384 (decimator 30 having a decimation ratio of 384) and the digital data stream emerging on line 32 is therefore at, on average, a 48 kHz data rate.

Sigma-delta modulator 20 is preferably an n-th order m-bit sigma-delta modulator. The higher the order of the sigma-delta modulator, the better the noise shaped characteristics of the output signal on line 23. The output signal on line 23 of sigma-delta modulator 20 is chosen to be m-bits (where $m \geq 1$ n and is more than one bit in a preferred embodiment) because, as the number of bits which control interpolator 18 is increased, the clock rate necessary to operate sigma-delta modulator 20 can be reduced. However, it is to be appreciated that the invention is not so limited. Sigma-delta modulator 20 could also be a one bit modulator if the clock frequency used to run the modulator is appropriately increased.

A key feature of the present invention is that the temporal spacing of the sampling points is controlled by the n-th order m-bit sigma-delta modulator such that any errors (i.e., noise on the sampling points) produced by this nonuniform sampling are shaped in the frequency domain. That is, the digital signal produced by the interpolation/decimation process of the present invention is temporally noise-shaped. As is well-known in the field of sigma-delta systems, this error produced by noise resulting from the nonuniform sampling can be removed by conventional digital filtering techniques.

Several other advantages are also obtained. By appropriate choice of the rate at which the sigma-delta spaced sampling points are generated and the number of bits used in controlling the spacing of these sampling points, the signal-to-noise ratio of the digital data stream on line 32 can be controlled. Further degrees of freedom are available by varying the order of the sigma-delta modulator used to control the sampling points. In another aspect of the invention, the degree of filtering used on the digital data stream on line 19 can also be varied to vary the signal-to-noise ratio as well.

Figure 3:
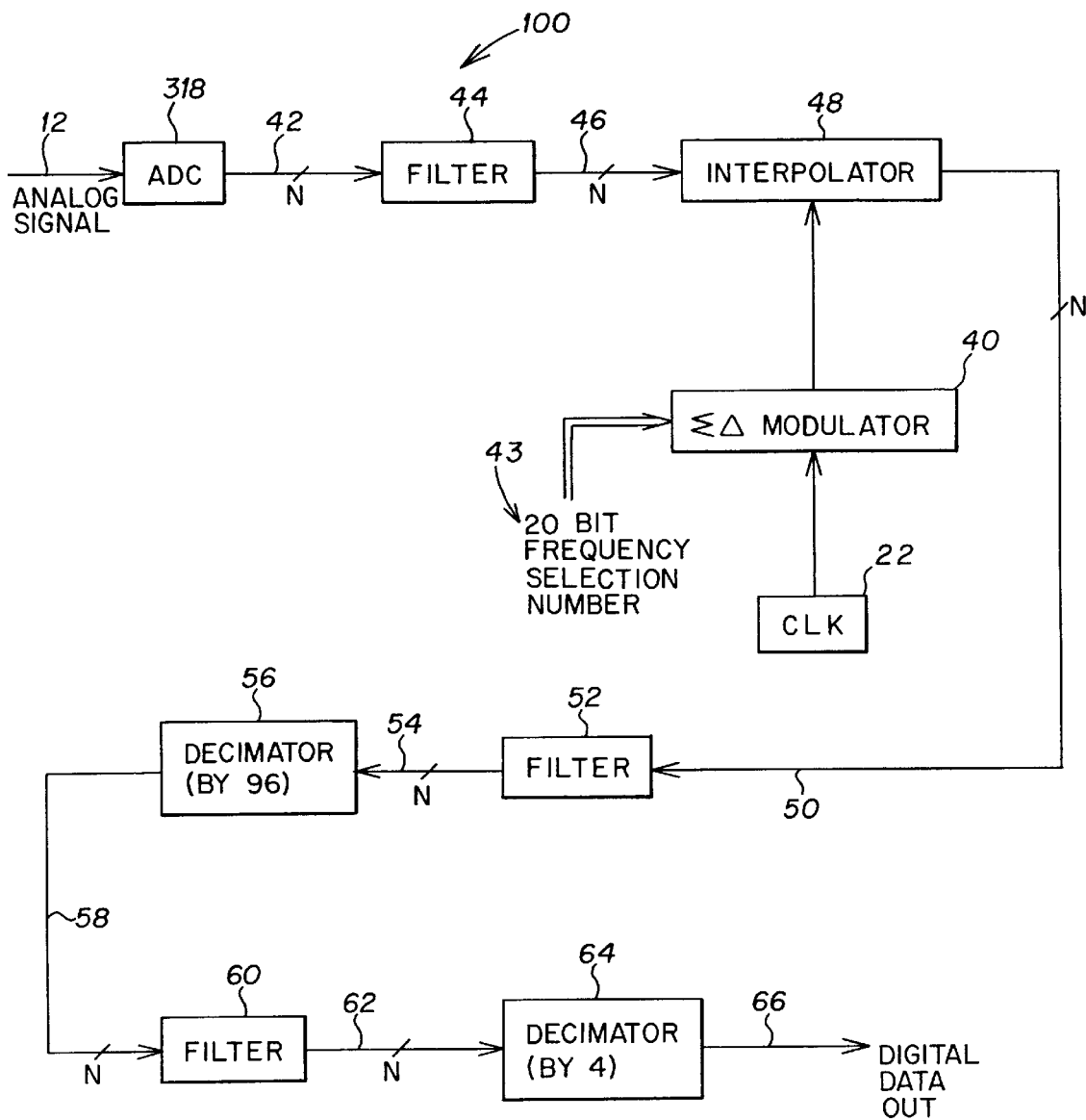
FIG. 3 is a more detailed block diagram of a sigma-delta ADC circuit incorporating the first embodiment of the invention.

FIG. 3 illustrates a more detailed embodiment of the ADC of FIG. 2. In the circuit 100 of FIG. 3, the analog signal on line 12 is converted into an oversampled constant rate digital data stream on line 42 by analog to digital converter 30. Analog to digital converter 30 is preferably a sigma-delta ADC because this results in the digital data stream on line 42 being already oversampled, thus reducing the factor by which the data stream on line 42 must have its sampling rate increased before decimation. In one embodiment, the n-bit wide digital data stream on line 42 has a constant data rate of 3.072 mHz. The constant rate digital data stream on line 42 is filtered by low pass filter 44 to remove out of band noise and sigma-delta noise that result from the analog to digital conversion process carried out by ADC 30. The filtered digital data stream on line 46 is then sent to interpolator 48. Interpolator 48 increases the sample rate of the digital data stream on line 46 by using a sample and hold technique or an interpolation technique under control of sigma-delta modulator 40. The use of a sample and hold technique is advantageous because it automatically compensates for the energy lost in creating the images of the original signal due to the interpolation process. The higher rate digital data stream on line 50 is then sent to low-pass filter 52 that removes images and sigma-delta noise from the digital data stream on line 50 that may be present as a result of the interpolation process. In one embodiment, digital filter 52 is a sinc $96^3$-type filter. Filter 52 could, however, by any type of IIR or FIR filter.

The filtered digital data stream on line 54 is then sent to a decimation block 56 that decimates the digital data stream on line 54 by a fixed decimation ratio (96 in the illustrated embodiment). The decimated digital data stream on line 58 is then filtered by low pass filter 60 to remove images and sigma-delta noise as a result of the nonuniform sampling. The filtered digital data stream on line 62 is then sent to a decimation block 64 that decimates the digital data stream on line 62 by a fixed decimation ratio (4 in the illustrated embodiment) to provide the digital data stream on line 66 at the data rate selected by a 20 bit sampling frequency selection number 43.

It is to be noted that digital data streams on lines 42, 46, 50, 54, 58, and 62 are indicated as being n-bits wide in FIG. 3. N may be any number of bits and is typically chosen to be the widest bit stream commensurate with the signal-to-noise ratio requirements of the particular application. Furthermore, the digital data streams may be different widths on each of the lines.

The n-th order m-bit sigma-delta modulator 40 provides a four-bit number on line 41 that controls interpolator 48 to produce the digital data stream on line 50. In one embodiment, sigma-delta modulator 40 is a fourth order four-bit modulator. Sigma-delta modulator 40 is also clocked using a 3.072 mHz clock.

In one embodiment, a twenty-bit frequency selection number 42 is input into sigma-delta modulator 40. Frequency selection number 42 ranges from $-2^{19}$ to $+2^{19}$. This twenty-bit number controls the precision with which the four-bit number output by sigma-delta modulator 40 represents the desired sampling rate of the output digital data stream on line 66. Sigma delta modulator 40 modulates the twenty-bit number to produce sigma-delta modulated four-bit codes that control interpolator 48. The first bit of the code is a sign bit. The remaining three bits produce codes that control the interpolation ratio (i.e., the factor by which the sample rate of the digital data stream on line 46 is increased) provided by interpolator 48 to effectively convert the sample rate of the data stream.

Table 1 illustrates the relationship among the four-bit codes that are produced by sigma-delta modulator 20, the ratio by which the sample rate of the digital data stream on line 46 is increased, and the sampling frequency that the four-bit code corresponds to when modulator 20 is clocked using a 3.072 mHz clock. Some examples will illustrate the operation of the system.

TABLE 1

| 4 BIT CODE | SAMPLE RATE INCREASE FACTOR ALLOW P CLOCKS TO PASS THROUGH | CORRESPONDING TO SAMPLING FREQUENCY OF (kHz) |
|---|---|---|
| +4 | 8 | 64 |
| +3 | 7 | 56 |
| +2 | 6 | 48 |
| +1 | 5 | 40 |
| 0 | 4 | 32 |
| -1 | 3 | 24 |
| -2 | 2 | 16 |

TABLE 1-continued

| 4 BIT CODE | SAMPLE RATE INCREASE FACTOR ALLOW P CLOCKS TO PASS THROUGH | CORRESPONDING TO SAMPLING FREQUENCY OF (kHz) |
|---|---|---|
| -3 | 1 | 8 |
| -4 | 0 | DC |

Assume, for purposes of illustration, that the sample rate of the digital data stream on line 42 is an oversampled data stream having a constant sample rate of 3.072 mHz. Assume that the desired sample rate of the digital data stream on line 66 is 48 kHz. To produce the digital data stream on line 66 at 48 kHz, the digital data stream on line 62 must have a sample rate of 192 kHz and the digital data stream on line 50 must have a sample rate of 18.432 mHz. Therefore, twenty-bit frequency selection number 43 is selected such that upon sigma-delta modulation by the fourth order four-bit sigma-delta modulator 20, the four-bit codes generated will be, on average, a +2 code, although other four-bit codes will be produced but with a lower frequency of occurrence.

Interpolator 48 uses a sample and hold technique under control of sigma-delta modulator 40 to increase the sample rate of the digital data stream on line 46. The use of a sample and hold technique is advantageous because it automatically compensates for the energy lost in creating the images of the original signal due to the interpolation process.

A key point to remember is that the +2 code is the resulting average of all codes produced by sigma-delta modulator 40 upon sigma-delta modulation of twenty-bit frequency selection number 42. A +2 code is not produced every time sigma-delta modulator 40 is clocked even though the sample rate of the digital data stream on line 42 and the sample rate of the digital data stream on line 66 are related to each other by an integer multiple. Even if the sample rates were related to each other by an integer multiple, any errors, no matter how small, that result in a temporal displacement between the sample points in the digital data stream on line 42 and the sample points in the rate-converted digital data stream on line 52 would increase the signal-to-noise ratio to a point where the analog to digital conversion process would not be acceptable. In the present invention, the time base (i.e., the temporal spacing between samples) is sigma-delta modulated so that the errors due to temporal displacement between the digital data stream on line 42 and the rate-converted digital data stream on line 50 that cause noise are pushed into a higher frequency range. This noise is then removed by conventional filtering techniques such as in digital filters 52 and 60.

As shown in Table 1, the +2 code (on average) directs interpolator 48 to increase the sample rate of the digital data stream on line 46 by a factor of six. Interpolator 48 uses a sample and hold technique under control of sigma-delta modulator 40 to increase the sample rate of the digital data stream on line 46. The use of a sample and hold technique is advantageous because it automatically compensates for the energy lost in creating the images of the original signal due to the interpolation process. Alternatively, interpolator 48 may increase the sample rate by interpolation using a zero fill technique to insert six zeros between every sample of the digital data stream on line 46. Inserting zeros into the digital data stream on line 46 will reduce the gain of the original signals because of dilution of the signal. The higher sample rate digital data stream on line 50 has a sample rate of, on average, 18.432 mHz. Upon decimation by decimator circuit 56 and decimator circuit 64, the digital data stream on line 66 emerges with a sample rate of, on average, 48 kHz.

In another example, assume that the desired sample rate of the digital data stream on line 66 is 4 kHz. To produce the digital data stream on line 66 at 4 kHz, the digital data stream on line 62 must have a sample rate of 16 kHz and the digital data stream on line 50 must have a sample rate of 1.536 mHz. Therefore, twenty-bit frequency selection number 43 is selected such that sigma-delta modulator 40 produces, on average, an equal number of −3 and −4 codes, although other four-bit codes will be produced, but with a lower frequency of occurrence. As shown in Table 1, the −3 code directs interpolator 48 not to increase the sample rate (because the sample rate increase factor is 1). This corresponds to a sampling frequency of 8 kHz for the clock frequencies and interpolation ratios illustrated.

The −4 code controls interpolator 48 to increase the sample rate of the digital data stream by a factor of zero. That is, interpolator 48, in response to a −4 code, produces no output, thus effectively decimating the digital data stream on line 46.

At the illustrated interpolation ratios and clock frequencies, the −3 code represents a sampling frequency of 8 kHz and the −4 code represents a sampling frequency of DC (i.e., no signal). Therefore, on average of many samples, the −3 and −4 four-bit codes represent a sampling frequency of 4 kHz. Thus, on average of many samples, after decimation by decimator 56 and decimator 64, the data rate of the digital data on line 66 will be, on average, 4 kHz.

One skilled in the art will appreciate that any sampling frequencies within the 0 to 64 kHz range may be produced by varying the ratio of four-bit codes produced by sigma-delta modulator 40. For example, to obtain a sampling frequency between 56 kHz and 64 kHz, the appropriate ratio of +3 and +4 codes would be output by sigma-delta modulator 40 as a function of twenty-bit number 43. One skilled in the art will also appreciate that any sample rate within the working range of the system can be produced through the appropriate combination of four-bit codes.

Although a four-bit sigma-delta modulator has been illustrated, the invention is not so limited. For example, a sigma-delta modulator that outputs fewer bits can be used if the modulator is clocked at a faster rate. In the same manner, a sigma-delta modulator that outputs a larger number of bits can be used and the modulator can then be clocked at a lower rate. One skilled in the art will appreciate that the number of bits used and the clock rate used are a function of the desired noise shaping and signal-to-noise ratio and may be traded off depending upon the requirements of a particular application.

One skilled in the art will appreciate that, in the circuit of FIG. 3, both the magnitude and the temporal spacing of the digital samples are sigma-delta encoded by ADC 30 and sigma-delta modulator 40, respectively.

One of the advantages of sigma-delta modulation of the time base is that the jitter or time variation produced on the sampling time (or sampling interval) due to the fact that interpolator 48 (under control of sigma-delta modulator 20) produces output samples at time intervals that may not correspond exactly to the specified output sampling frequency (0 kHz to 64 kHz in the illustrated embodiment) is varied by the sigma-delta modulator so that any errors that result from the noise or jitter around the sampling point have a sigma-delta noise characteristic that can be removed by conventional filtering techniques, as for example, by filter 26 or 52.

Figure 4:
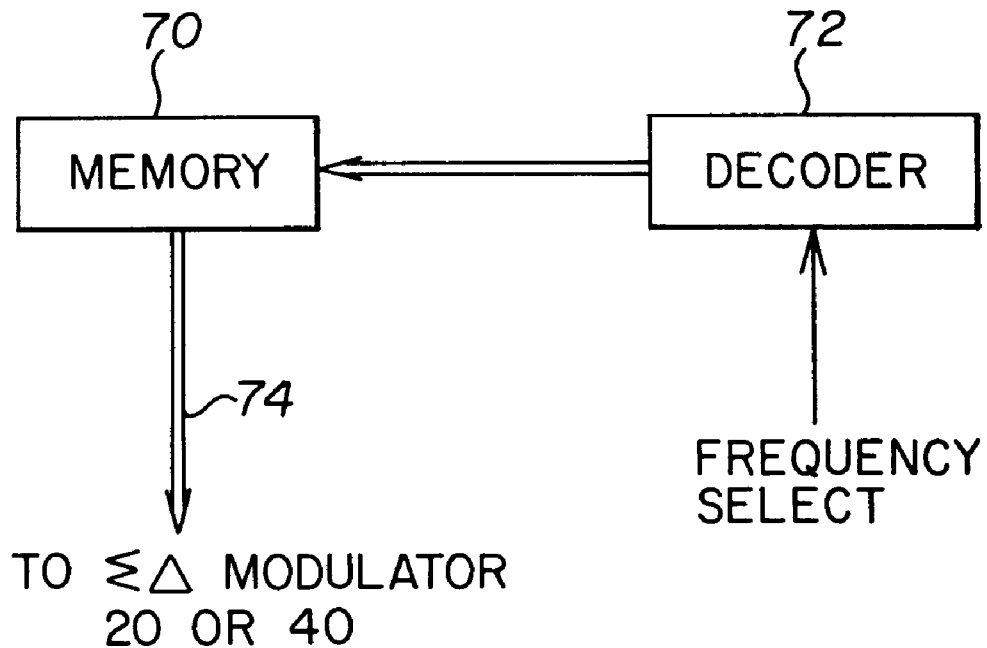
FIG. 4 is a block diagram of a circuit for supplying previously stored frequency numbers to the n-th order m-bit sigma-delta modulator of FIGS. 2–3, and FIGS. 7–8, and FIG. 10.

FIG. 4 is a block diagram of an alternative system for determining frequency selection number 43. In FIG. 4, a memory 70 (which may be RAM or ROM, for example) is used to store a look up table containing twenty-bit numbers and the sampling frequency to which they correspond. In response to a frequency select signal from a user or an external source, decoder 72 selects the twenty-bit number from memory 70 most closely corresponding to the desired sampling frequency specified by the frequency select signal. The twenty-bit number is then be output on bus 74 to sigma-delta modulator 40.

Figure 5:
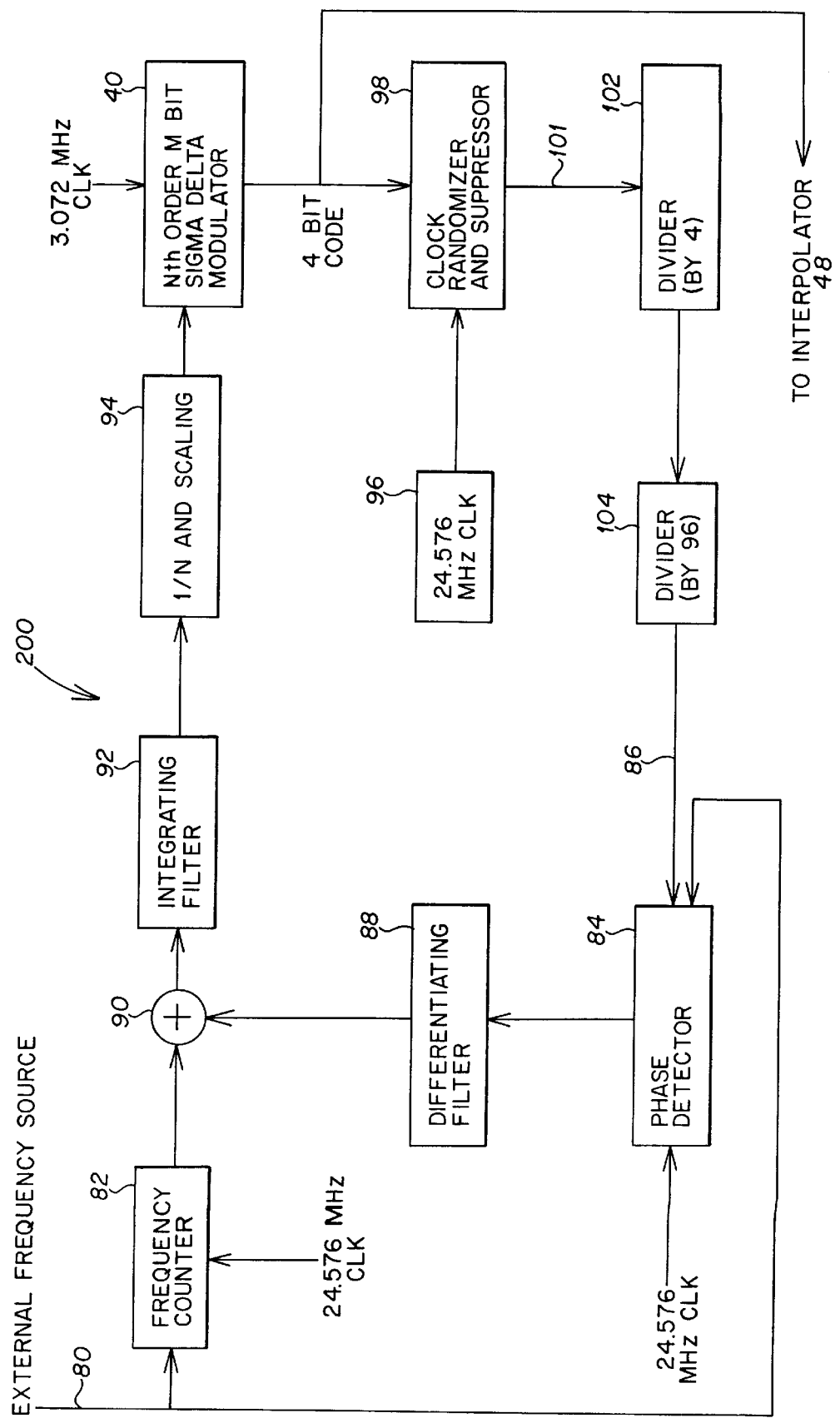
FIG. 5 is a block diagram of a locking circuit that may be used in conjunction with the circuits of FIGS. 2–3, FIGS. 7–8, and FIG. 10 to lock the ADC to an externally supplied clock signal.

FIG. 5 illustrates another embodiment of the invention in which a digital phase locked loop 200 incorporating sigma-delta modulator 20 or 40 is added to the circuit of FIGS. 2 or 3 to allow the analog to digital converter to operate at and lock to an external clock signal such as an off-chip clock signal. In circuit 200, an external clock source on line 80 is applied to a frequency counter 82 that produces a signal representative of the period of external frequency source on line 80. In addition, the external clock on line 80 is applied to phase detector 84 that produces a signal proportional to the phase difference between the external clock on line 80 and a signal on line 86 to be described in more detail hereinafter. The output of phase detector 84 is filtered by differentiating filter 88 and summed in summer 90 with the signal representative of the period of the external clock source on line 80 from the frequency counter 82. The output of summer 90 is fed into an integrating filter 92 that functions as a low-pass filter. The output of integrating filter 92 is then sent to a circuit 94 that converts the period to a frequency by performing a 1/period function and providing any appropriate scaling. The signal from circuit 94 is then sent to sigma-delta modulator 40. The four-bit code from sigma-delta modulator 40 is used to control interpolator 18 or interpolator 48 in the same manner as described in connection with the embodiment of FIGS. 2 and 3, respectively.

The four-bit code is also fed into a clock generation circuit 98 that effectively produces an output clock at 384 times greater than the signal on line 80. Circuit 118 performs this function by suppressing a certain number of 24.576 mHz clock cycles in response to the four-bit code from sigma-delta modulator 40. The following examples will serve to illustrate. Assume sigma-delta modulator 40 is clocked by a 3.072 mHz clock. For every 3.072 mHz clock, there are eight 24.576 mHz clocks applied to circuit 98. In accordance with Table 1, circuit 118 suppresses a number of 24.576 mHz clocks as a function of the four-bit code output by sigma-delta modulator 40. For example, if the external frequency source on line 80 is 48 kHz, then sigma-delta modulator 40 outputs, on average, a +2 code. The +2 code directs circuit 98 to allow six out of every eight 24.576 mHz clocks to pass through. Stated another way, circuit 98 suppresses two out of every eight 24.576 mHz clocks in response to a +2 code.

If the external clock frequency source is 4 kHz, then sigma-delta modulator 40 outputs, on average, an equal number of −3 and −4 codes. The −3 code directs circuit 98 to allow one out of every eight 24.576 mHz clocks to pass through (i.e., circuit 98 suppresses seven out of every eight 24.576 mHz clocks in response to a −3 code). The −4 code directs circuit 98 to allow no 24.576 mHz clocks to pass through (i.e., circuit 98 suppresses eight out of every eight 24.576 mHz clocks in response to a −4 code). On average, therefore, one out of every sixteen 24.576 mHz clocks will pass through suppressor circuit 118 in response to an average of −3 and −4 codes.

If, however, the same clocks are suppressed for each four-bit code from sigma-delta modulator 40, then unwanted tones may appear in the output data stream on line 101. Therefore, circuit 98 also performs the additional function of randomly suppressing clock cycles in order to suppress unwanted tones in the output data stream on line 101. Randomizing ensures that pulses in each of the eight positions (recall that there are eight 24.576 mHz clock pulses for each 3.072 mHz clock pulse controlling sigma-delta modulator 78) are suppressed equally, on average. This may be accomplished by providing a latch for each bit position that is set whenever the pulse in that position is suppressed. Pulses in that position are not suppressed again until all latches corresponding to all the positions have been set, at which time the latches are cleared and the sequence of suppression is repeated. This reduces tones that result from the clock pulse suppressor. Clock randomizer/suppressor circuits are well-known in the art. One example of such a circuit may be found in *Phase Lock Loops, Theory, Design, and Applications* by Dr. Roland E. Best, published by McGraw-Hill Book Company, © 1984. Clock randomizer/suppressor circuit 98 outputs a clock signal on line 101 that is sent through divider 102 having a divider ratio of 4 and a divider 104 having a divider ratio of 4 that reduce the suppressed and randomized 24.576 mHz clock output by clock randomizer/suppressor circuit 98 to the frequency of the external clock on line 80. Circuits 102 and 104 may be counters.

For the examples just discussed above, if the external clock on line 80 is 48 kHz, then the signal on line 101 is approximately 18.432 mHz. When decimated by 96 and then 4, the signal on line 86 is 48 kHz. If the external clock on line 80 is 4 kHz, then the signal on line 101 is approximately 1.536 mHz. When decimated by 96 and then 4, the signal on line 86 is 4 kHz.

Circuit 94, sigma-delta modulator 40, and clock randomizer/suppressor circuit 98 together form a digitally-controlled oscillator.

This particular embodiment of the present invention thus allows an ADC to, after converting an analog signal to digital data at a constant data rate, lock to an externally supplied clock source to allow operation of the ADC at a clock frequency that is not necessarily the same as or even an integer or rational relationship with the master clock controlling the ADC.

The embodiment of the invention illustrated in FIGS. 2–4 may be characterized as using variable interpolation followed by fixed decimation. That is, the digital data stream on line 13 or 42 is variably interpolated under control of sigma-delta modulator 20 or 40, respectively, to variably increase the sample rate. This higher sample rate digital signal is then decimated by a fixed ratio to provide the digital data stream on line 32 or 66 at another sample rate.

Figure 6:
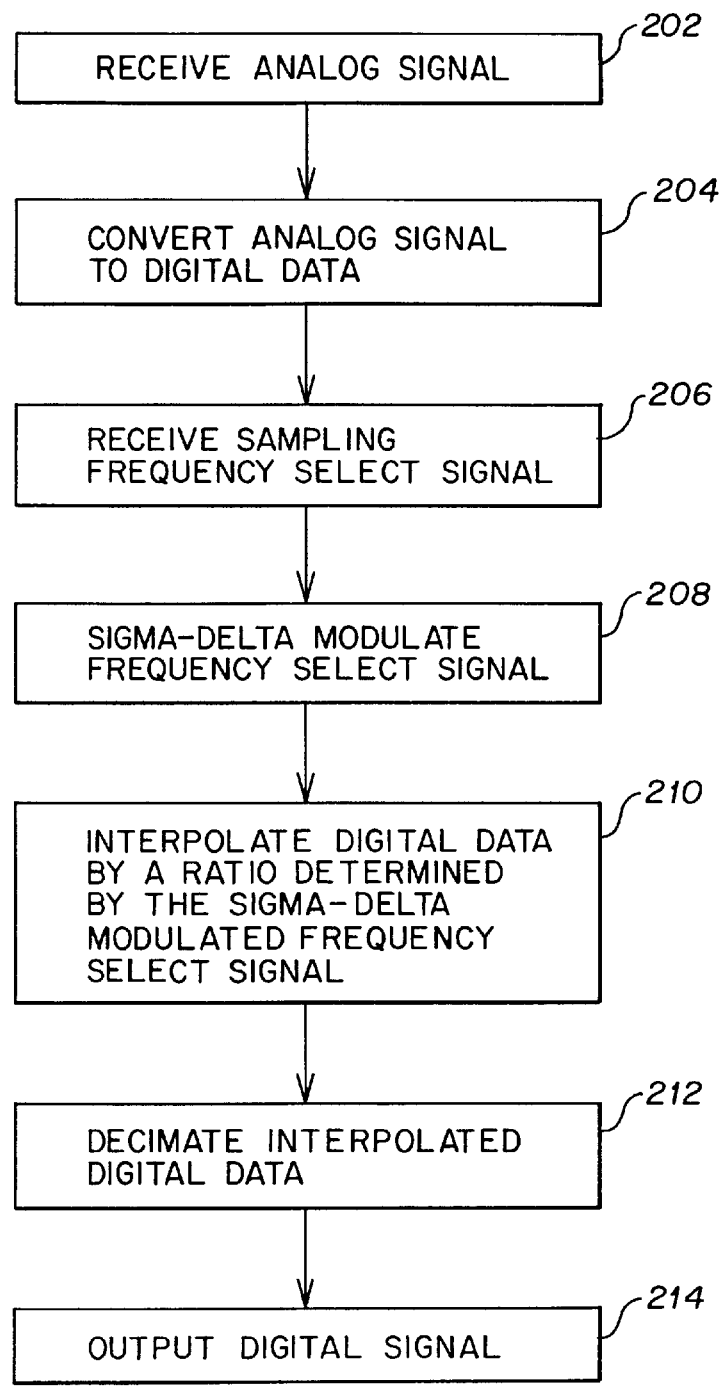
FIG. 6 is a flow chart illustrating the steps of the method of the invention using variable interpolation followed by fixed decimation.

Reference is now made to FIG. 6 which is a flow chart illustrating a first embodiment of the method of the present invention. FIG. 6 illustrates the method of variable interpolation followed by fixed decimation.

In FIG. 6, the method begins by receiving an analog signal in step 202. From step 202, the method proceeds to step 204 in which the analog signal is converted into digital data. The digital data is typically at a constant data rate. From step 204, the method proceeds to step 206 in which a sampling frequency select signal representative of the desired output sample rate is received. From step 206, the method proceeds to step 208 in which the frequency select signal is sigma-delta modulated. From step 208, the method proceeds to step 210 in which the digital data is interpolated by a ratio determined by the sigma-delta modulated frequency select signal to increase the sample rate of the digital data. From step 210, the method proceeds to step 212 in which the interpolated digital data is decimated by a fixed ratio to provide the output digital data at the desired sample rate. From step 212, the method proceeds to step 214 in which the digital signal is output.

Figure 7:
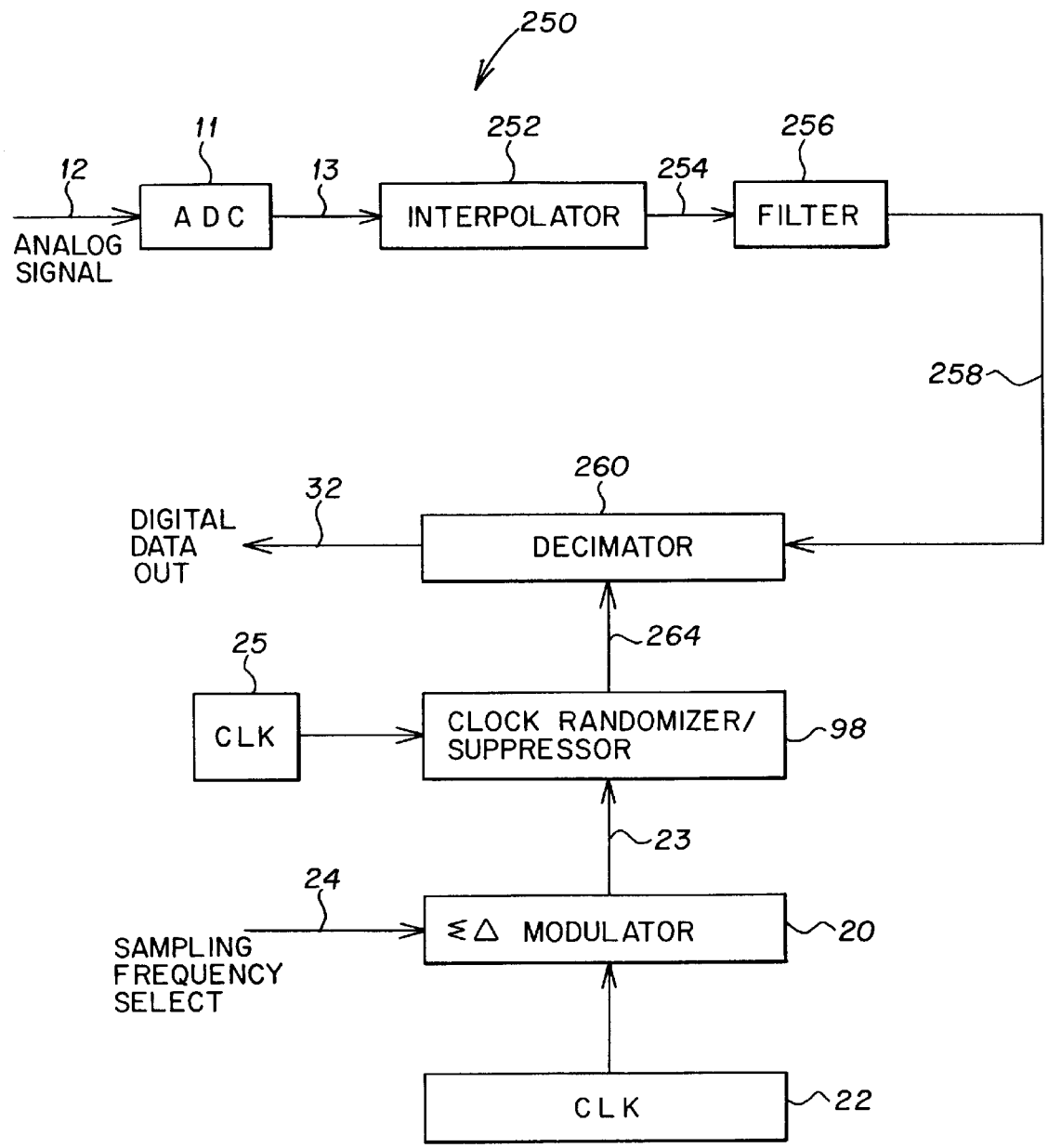
FIG. 7 is a block diagram of a general ADC circuit incorporating a second embodiment of the invention.

FIG. 7 is a block diagram broadly illustrating a second embodiment of the invention. As with the first embodiment illustrated in FIGS. 2–3, the overall purpose of circuit 250 is to receive an analog signal on line 12 at any frequency within a predetermined working range of the system, convert this signal to a digital data stream, increase the sample rate of the digital data stream and then decimate this higher rate digital data stream so that the data presented on line 14 is at a desired sampling rate. The second embodiment uses fixed interpolation followed by variable decimation. ADC 11 is FIG. 7 may be the same as that illustrated in FIGS. 2–3.

In the circuit illustrated in FIG. 7, the analog signal on line 12 is converted to a digital data stream on line 13 by ADC 11. The digital data stream on line 13 typically has a constant sample rate. An interpolator 252 receives the digital data stream on line 13 at the predetermined data rate. Interpolator 253 increases the sample rate of the digital data stream (that is, converts the digital data stream into a higher sample rate digital data stream) on line 254 by, for example, inserting zeros between data samples, in a manner well-known to those skilled in the art. One skilled in the art will appreciate that other techniques may be used for increasing the sample rate of the data stream on line 13, such as sample and hold techniques. As noted previously, the purpose of interpolator 252 is to increase the sample rate of the digital data stream on line 13 to create a so-called oversampled signal. It is to be appreciated that analog to digital converter 11 may be an oversampling type converter itself, thus reducing the ratio by which interpolator 252 must increase the sample rate. However, ADC 11 may by any type of analog to digital converter whose output sample rate is then increased by interpolator 252.

A higher sample rate digital data stream on line 254 is then sent to a digital filter 256 which removes any images of the original digital signal as a result of the interpolation process. The filtered digital data stream on line 258 is then sent to a decimation block 260 that decimates the digital data stream on line 258 under control of clock randomizer/suppressor circuit 262 which is in turn controlled by the sigma-delta modulator 20 as will be explained in more detail hereinafter. Although filter 256 and decimation block 260 have been illustrated as separate circuit elements for illustrative purposes, one skilled in the art will appreciate that these functions may be performed by a single computational element, such as an FIR or IIR filter in a well-known manner. Sigma-delta modulator 20 operates in the same manner as described in connection with the embodiment of FIGS. 2–3.

The m-bit code output signal on line 23 from sigma-delta modulator 20 is fed into a clock randomizer/suppressor circuit 98 that effectively produces an output clock at 384 times greater than the data rate of the digital signal on line 13. In one embodiment, clock 25 is a 24.576 mHz clock. Circuit 98 operates in the same manner as already described in connection with FIG. 5. The following explanation is provided for additional clarification.

Circuit 98 provides a clock on line 264 by suppressing a certain number of cycles of clocks from clock 25 in response to the m-bit code on line 23 from sigma-delta modulator 20. If, however, the same clocks in the same temporal positions are suppressed for each multi-bit code from sigma-delta modulator 20, then unwanted tones may appear in the output data stream on line 264. Therefore, circuit 98 also performs the additional function of randomly suppressing clock cycles in order to prevent unwanted tones in the output data stream on line 264. As described previously, clock suppressor and randomizer circuits are well-known in the art. One example of such a circuit may be found in *Phase Locked Loops* by Dr. Roland E. Best, published by McGraw-Hill Book Company, © 1984. Clock suppressor/randomizer circuit 98 is needed in the second embodiment to produce a clock on line 25 having a clock frequency that is 384 times the data rate specified by sampling frequency selection number 24 since sigma-delta modulator 20 is clocked using a fixed clock frequency and a variable clock frequency is needed to variably decimate the data on line 258. Clock randomizer/suppressor circuit 98 outputs a clock signal on line 265 that controls the decimation of decimator 260.

In one embodiment, the digital data stream on line 13 has a data rate of 3.072 mHz. This n-bit wide digital data stream on line 13 is fed into interpolator 252. Interpolator 252 increases the sample rate of the digital data stream on line 13 by a factor of eight using, for example, a zero fill technique that inserts zeros between the digital samples. As is well-known, the parameters of filter 256 can be adjusted to compensate for any loss of gain. A higher sample rate signal on line 254 output by interpolator 252 (now at 24.576 mHz) is then fed into digital filter 256.

As stated previously, other techniques, such as sample and hold techniques, may be used to increase the sampling rate in place of interpolator 252.

Figure 8:
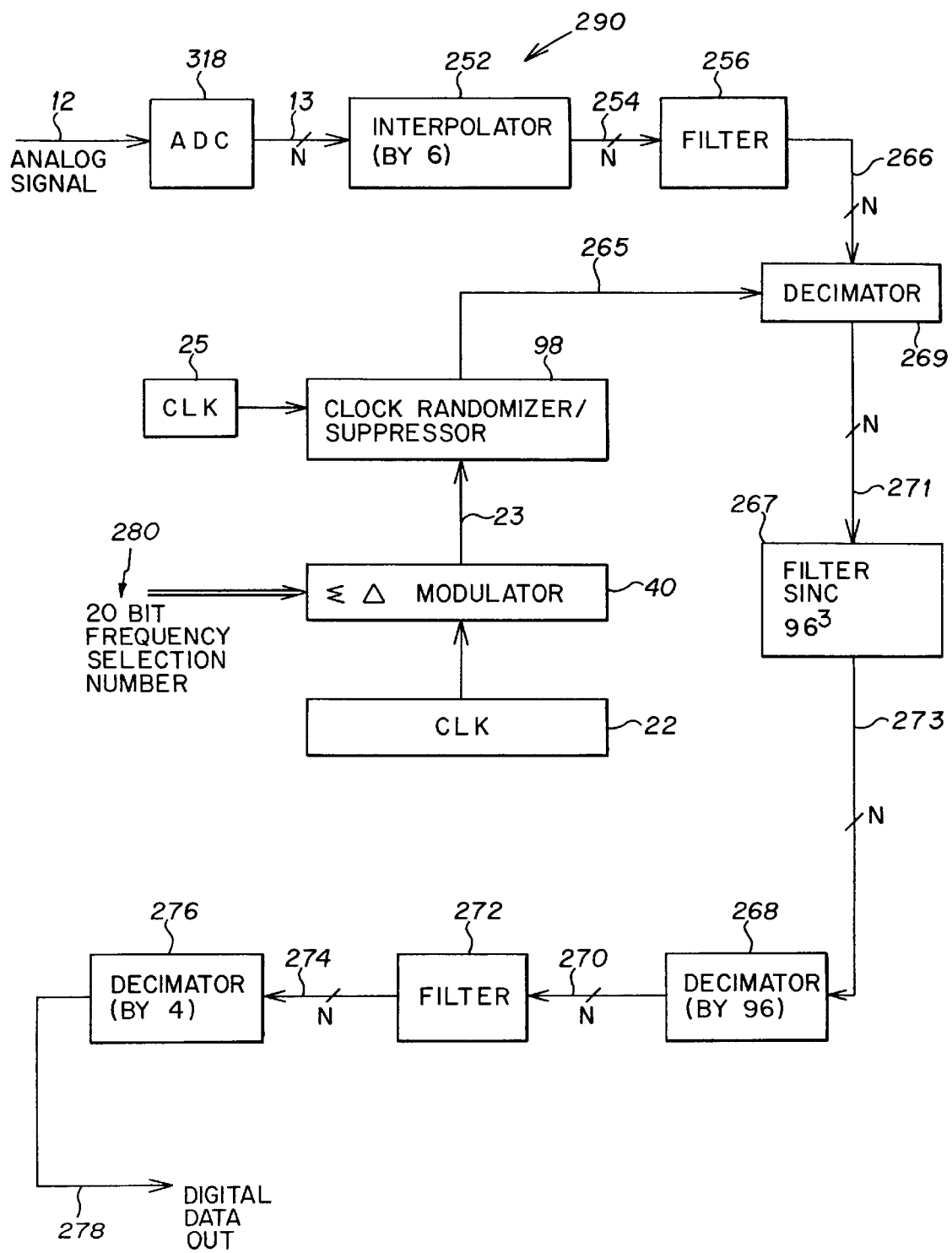
FIG. 8 is a block diagram of a sigma-delta ADC circuit incorporating the second embodiment of the invention.

In the more detailed embodiment illustrated in FIG. 8, digital filter 256 is a filter that is designed to have zeros at the image frequencies of the digital data stream on line 254. The filtered higher sample rate digital data on line 266 is then sent to decimator 269 that decreases the sample rate by a variable ratio so that the digital data on line 271, after filtering by filter 264 and decimation by a fixed ratio of ninety-six in decimator 268 and a fixed ratio of four in decimator 276, emerges on line 278 with a sample rate specified by frequency selection number 280. Filter 264 is a sinc $93^3$-type filter but could be any type of FIR or IIR filter. In addition, filter 264 and decimator 269 could be combined into a single element as noted in connection with FIG. 7.

Sigma-delta modulator 20 produces a four-bit code representative of frequency selection number 280 at a constant rate of 3.072 mHz in response to clock 22. However, decimator 269 must produce the digital data stream on line 271 having sample rates of, for example, between 1.536 mHz and 24.576 mHz depending upon the desired sample rate of the output data stream. Therefore, clock randomizer/suppressor circuit 98 is needed to produce a variable rate clock on line 25 or 265 to variable decimate the data on line 266.

Table 1 illustrates the relationship among the four-bit codes that are produced by sigma-delta modulator 20, the number of clocks that are allowed to pass through randomizer/suppressor circuit 98, and the output sample rate that the four-bit code corresponds to when modulator 20 is clocked using a 3.072 mHz clock and when clock randomizer/suppressor circuit 98 is clocked using a 24.576 mHz clock. Some examples will illustrate the operation of the second embodiment.

Assume, for purposes of illustration, that the sample rate of the digital data stream on line 13 is an oversampled data stream having a constant sample rate of 3.072 mHz. Assume that the desired sample rate of the digital data stream on line 278 is 48 kHz. Interpolator 252 increases the data rate of the digital data stream on line 13 by a factor of eight to 24.576 mHz. To produce the digital data stream on line 278 at 48 kHz, the digital data stream on line 274 must have a sample rate of 192 kHz and the digital data stream on line 266 must have a sample rate 18.432 mHz. Therefore, twenty-bit frequency selection number 280 is selected such that upon sigma-delta modulation by the fourth order four-bit sigma-delta modulator 20, the four bit codes generated will be, on average, a +2 code although other four bit codes will be produced but with a lower frequency of occurrence.

The +2 code is then applied to clock randomizer/suppressor circuit 98. For every 3.072 mHz clock applied to sigma-delta modulator 20, there are eight 24.576 mHz clocks applied to clock randomizer/suppressor circuit 98. In accordance with Table 1, circuit 98 suppresses a number of 24.576 mHz clocks as a function of the four-bit code output by sigma-delta modulator 20. The +2 code directs circuit 98 to allow six out of every eight 24.576 mHz clocks to pass through. Stated another way, circuit 98 suppresses two out of every eight 24.576 mHz clocks in response to a +2 code. As discussed in conjunction with the embodiment of FIG. 7, circuit 98 randomly suppresses the specified number of clock cycles in order to prevent unwanted tones in the output data stream on line 26.

In another example, assume that the desired sample rate of the digital data stream on line 278 is 4 kHz. Interpolator 252 increases the data rate of the digital data stream on line 13 by a factor of eight to 24.576 mHz. To produce the digital data stream on line 278 at 4 kHz, the digital data stream on line 274 must have a sample rate of 16 kHz and the digital data stream on line 266 must have a sample rate of 1.536 mHz. Therefore, twenty-bit frequency selection number 280 is selected such that sigma-delta modulator 20 produces, on average, an equal number of −3 and −4 codes although other four-bit codes will be produced, but with a lower frequency of occurrence. That is, occasionally, −2, −1, and even less frequently, +1, +2 codes will be produced. As shown in Table 1, the −3 code directs circuit 98 to allow one out of every eight 24.576 mHz clocks to pass through (i.e., circuit 98 suppresses seven out of every eight 24.576 mHz clocks in response to a −3 code). The −4 code directs circuit 98 to allow no 24.576 mHz clocks to pass through (i.e., circuit 98 suppresses eight out of every eight 24.576 mHz clocks in response to a −4 code). On average, therefore, one out of every sixteen 24.576 mHz clocks will pass through suppressor circuit 98 in response to an average of −3 and −4 codes.

At the illustrated interpolation ratios and clock frequencies, the −3 code represents a sampling frequency of 8 kHz and the −4 code represents a sampling frequency of DC (i.e., no signal). Therefore, on average of many samples, the −3 and −4 four-bit codes represent a sampling frequency of 4 kHz times 384 to provide a clock on line 265 or 25 at (4 kHz (384)=1.536 mHz.

Figure 10:
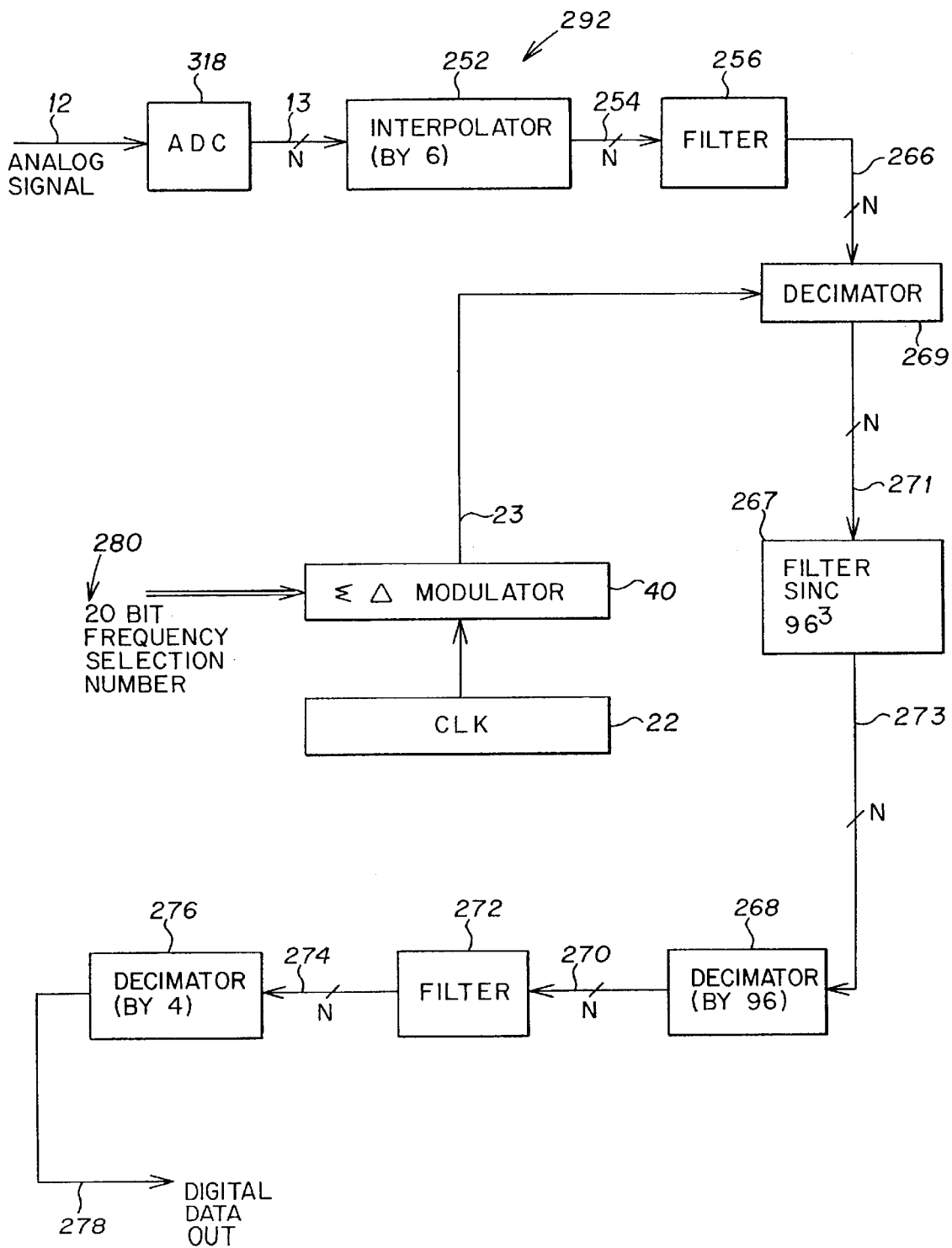
FIG. 10 is a block diagram of ADC circuit incorporating a third embodiment of the invention.

It is to be noted that digital data streams 13, 254, 266, 271, 273, 270, and 274 are indicated as being N-bits wide in FIGS. 8 and 10. N may be any number of bits and is typically chosen to be the widest bit stream commensurate with the signal-to-noise ratio requirements of the particular application.

The embodiment of the invention illustrated in FIGS. 7–8 may be characterized as using fixed interpolation followed by variable decimation. That is, the digital data stream output by analog to digital converter 11 or 30 is interpolated by a fixed ratio to increase the sample rate. This higher sample rate digital signal is then variably decimated under control of sigma-delta modulator 20 and clock randomizer/suppressor circuit 98 to provide the digital data stream on line 32 or 278 at a sample rate within the working range of the system.

The second embodiment can generate sampling frequencies within the 0 to 64 kHz range by varying the ratio of four-bit codes in the same manner as the first embodiment. The second embodiment provides all of the features and advantages discussed in connection with the first embodiment. The second embodiment can also be used with the circuits illustrated in FIGS. 4 and 5 in the same manner.

Figure 9:
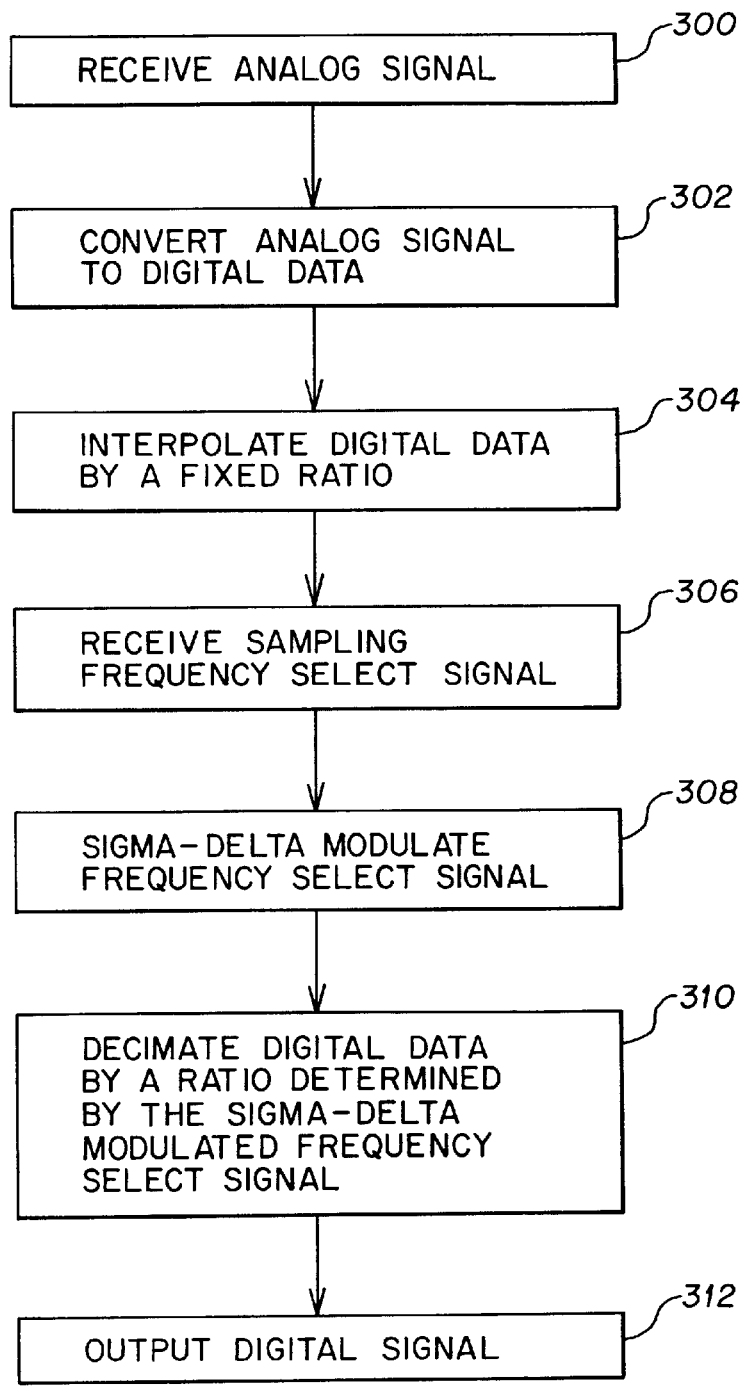
FIG. 9 is a flow chart illustrating the steps of the method of the invention using fixed interpolation followed by variable decimation.

Reference is now made in FIG. 9 which is a flow chart illustrating a second embodiment of the method of the present invention. FIG. 9 illustrates the method of the fixed interpolation followed by variable decimation.

In FIG. 9, the method begins by receiving an analog signal in step 300. From step 300, the method proceeds to step 302 in which the received analog signal is converted into digital data. The digital data is typically at a constant data rate. From step 302, the method proceeds to step 304 in which the digital data is interpolated by a fixed ratio to increase the sample rate of the digital data. From step 304, the method proceeds to step 306 in which a sampling frequency select signal representative of the desired output sample rate is received. From step 306, the method proceeds to step 308 in which the sampling frequency select signal is sigma-delta modulated. From step 308, the method proceeds to step 310 in which the interpolated digital data is decimated under control of the sigma-delta modulated frequency select signal by a ratio determined by the sigma-delta modulated frequency select signal to provide digital data at the desired output sample rate. From step 310, the method proceeds to step 312 in which the digital signal is output.

Reference is now made to FIG. 10 which figure illustrates a third embodiment of the present invention. In particular, FIG. 10 modifies the circuit of FIG. 8 by eliminating the clock randomizer/suppressor circuit. In all other respects, the components and operation of the circuit of FIG. 10 are the same as those illustrated in FIG. 8. The circuit of FIG. 10 operates in accordance with the method illustrated in FIG. 9, namely, FIG. 10 performs a fixed interpolation of the digital data on line 13 followed by a variable decimation of the interpolated data on line 254 provide digital data on line 266 such that after decimation by decimation block 268 and decimation block 276, data emerges on line 278 at the data rate specified by sampling frequency select number 280.

Since the clock randomizer/suppressor circuit is eliminated, sigma-delta modulator 20 produces a four-bit code that directly controls the decimation ratio provided by filter 264.

Table 2 illustrates the relationship among the four-bit codes that are produced by sigma-delta modulator 20, the intervals at which decimator 269 produces an output, and the sampling frequency that the four-bit code corresponds to when modulator 20 is clocked using a 3.072 mHz clock. For example, a −4 code controls decimator 269 to produce one output for every sample on line 266 and a +3 code controls decimator 269 to produce one output every eighth samples on line 266. Decimator 269 operates in the same manner as the decimators discussed in connection with the first two embodiments.

TABLE 2

| 4 BIT CODE | PRODUCE AN OUTPUT EVERY P SAMPLES | CORRESPONDING TO SAMPLING FREQUENCY OF (kHz) |
|---|---|---|
| +5 | 10 | 4.8 |
| +4 | 9 | 5.333 |
| +3 | 8 | 6 |
| +2 | 7 | 6.857 |
| +1 | 6 | 8 |
| 0 | 5 | 9.6 |
| −1 | 4 | 12 |
| −2 | 3 | 16 |
| −3 | 2 | 24 |
| −4 | 1 | 48 |
| −5 | 0 | 00 |

Figure 11:
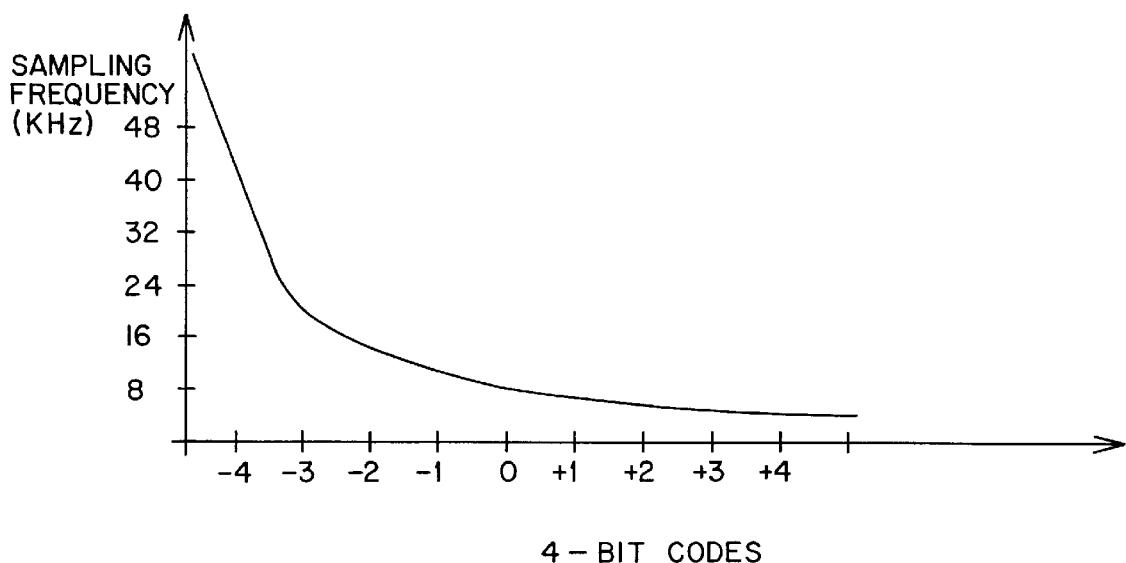
FIG. 11 is a graph illustrating the relationship between the four-bit codes and the corresponding sampling frequency in the circuit of FIG. 10.

FIG. 11 graphically illustrates the 1/n relationship between the four-bit codes and the corresponding sampling frequency. One skilled in the art will appreciate that the system is nonlinear in the sense of mapping the four-bit codes to a corresponding sampling frequency only because of the particular interpolation ratios, decimation ratios, and data rates chosen. However, the system itself is linear and, by providing an operation that corrects for the nonlinear mapping of the four-bit codes to the corresponding sampling frequency, a linearly mapped system as in the first two embodiments previously described can be provided. Alternatively, the interpolation ratios, decimation ratios, and data rates may be selected so that there is a linear relationship between four-bit codes and corresponding sampling frequencies. One skilled in the art will also appreciate that the 1/n relationship between four-bit codes and sampling frequency illustrated in FIG. 11 and Table 2 is meant to be exemplary only; other relationships are possible (for all embodiments of the invention) and are to be considered within the scope of the present invention.

The circuit illustrated in FIG. 10 can generate sampling frequencies within the 0 to 64 kHz range by varying the ratio of four-bit codes in the same manner as discussed in conjunction with the first two embodiments. The embodiment illustrated in FIG. 10 can also be used with the circuits illustrated in FIGS. 5 and 6 in the same manner.

Although the mapping between four-bit codes and sampling frequency is nonlinear in the embodiment illustrated in FIG. 10, this embodiment does provide certain advantages. In the embodiment illustrated in FIGS. 7–8, a clock randomizer/suppressor circuit was used. The clock randomizer/suppressor circuit can result in a system having a reduced signal to noise ratio as compared to the embodiments of the invention illustrated in FIGS. 2–3 and 10, since the clock randomizer/suppressor circuit reprocesses the sigma-delta modulated clock signal generated by the sigma-delta modulator and suppresses clock signals in a linear manner. This may degrade the noise shaping provided by the sigma-delta modulator. The circuit illustrated in FIG. 10 is advantageous in that the clock randomizer/suppressor circuit is eliminated and the circuit can still provide a fixed interpolation followed by variable decimation method of operation. Thus, the circuit of FIG. 10 can provide fixed interpolation followed by variable decimation with no degradation in the signal to noise ratio.

Another significant advantage of all embodiments of the present invention is that the ADC does not have to be capable of interpolating the digital data up to the lowest common frequency between the digital data rate and the modulator clock frequency. This is due to the sigma-delta modulation of the sampling intervals. Unlike prior art ADCs, the sampling interval does not have to correspond exactly to a fixed relationship between the digital data rate and the modulator clock. Since the sample rate is sigma-delta encoded in the present invention (i.e., temporally noise-shaped), the sample rate, on average, will represent the desired sample rate with the noise or jitter on the sampling points being pushed into the higher frequency ranges. The present invention thus takes advantage of sigma-delta encoding of the time base to avoid the need for interpolation to very high frequencies, which in the prior art, typically were in the gigahertz range. An additional benefit of this process is that on an integrated circuit, a significant savings in chip area can be realized by the use of lower interpolation ratios.

Another important advantage of the present invention is that the sigma-delta modulator 20 or 40 used to control interpolation or decimation can be clocked using a fixed clock frequency, allowing optimization of the modulator operation at the fixed clock frequency.

Finally, by appropriate combination of sigma-delta control codes in appropriate percentages, an infinite number of sample rates for the output digital data stream can be provided. These sample rates do not need to have any integer or rational relationship with the master clock used to run the ADC.

Although interpolation has been used herein to explain the method (and an interpolator as the apparatus) by which the digital data stream is converted into a higher sample rate digital data stream, the present invention is not so limited. Any method or apparatus that converts the digital data stream into a higher sample rate digital data stream may be used to practice the invention.

Interpolators and decimators useful in the present invention may be constructed as shown in Introduction to *Digital Signal Processing* by John Proakis and Dimitris Manolakis, published by Macmillan Publishing Company, © 1988.

Having thus described several particular embodiments of the invention, various alterations, modifications, and improvements will readily occur to those skilled in the art. For example, the present invention can be used in conjunction with any type of ADC or analog to digital conversion method and is not limited to sigma-delta ADCs. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. An analog to digital converter system, comprising:
   analog to digital conversion means for converting an analog signal to a digital signal a first data rate;
   interpolation means, coupled to the analog to digital conversion means, for receiving the digital signal having the first data rate and for supplying a digital signal having an increased data rate;
   decimation means, coupled to the interpolation means, for decimating the digital signal having the increased data rate to provide a digital signal having a second data rate; and
   modulator means, coupled to and controlling the decimation means, for providing a modulated output signal representative of the second data rate and for controlling the decimation means to provide the digital signal having the second data rate.

2. The analog to digital converter system of claim 1, wherein the modulator means comprises a sigma-delta modulator.

3. The analog to digital converter system of claim 2, wherein the modulated output signal is a multi-bit code.

4. The analog to digital converter system of claim 2, wherein the sigma-delta modulator is an $n^{th}$-order modulator where n is $\geq$ to 1.

5. The analog to digital converter system of claim 2, wherein the sigma-delta modulator modulates a sampling frequency select signal representative of the second data rate.

6. The analog to digital converter system of claim 5, further comprising a memory means for storing a plurality of frequency selection numbers representative of the second data rate and means for selecting one of the frequency selection numbers in response to a selection signal and for providing the selected number to the sigma-delta modulator as the sampling frequency select signal.

7. The analog to digital converter system of claim 5, wherein the interpolation means interpolates the digital signal having the first data rate by a fixed ratio.

8. The analog to digital converter system of claim 7, wherein the decimation means decimates the digital signal having the increased data rate by a ratio determined by the sampling frequency select signal to provide the digital signal having the second data rate.

9. The analog to digital converter system of claim 5, further comprising a clock generator means for generating, in response to the modulated output signal, a clock having a frequency representative of the second data rate.

10. The analog to digital converter system of claim 2, further comprising:
    phase-locked loop means, coupled to the sigma-delta modulator means, for receiving a signal representative of the second data rate, locking to the signal, and providing a control signal to the sigma-delta modulator means that controls the sigma-delta modulator means to provide the sigma-delta modulated output signal.

11. The analog to digital converter system of claim 1, further comprising a filter means, coupled between the interpolation means and the decimation means, for filtering out noise and images of the digital signal having the first data rate.

12. The analog to digital converter system of claim 1, wherein the analog to digital converter is a sigma-delta analog to digital converter.

13. An analog to digital converter system, comprising:
    an analog to digital converter;
    an interpolator having an input electrically coupled to an output of the analog to digital converter;
    a decimator having an input electrically coupled to an output of the interpolator; and
    a modulator electrically coupled a control input of the decimator and providing a temporally noise-shaped control signal that controls the decimation ratio provided by the decimator.

14. The analog to digital converter system of claim 13, wherein the analog to digital converter is a sigma-delta analog to digital converter.

15. A method of converting an analog signal to a digital signal, comprising the steps of:
    converting an analog signal to a digital signal having a first data rate;
    modulating a control signal to provide a modulated output signal representative of a second data rate;

increasing the first data rate to provide a digital signal having an increased data rate; and decimating the digital signal at the increased data rate in response to the modulated output signal to provide a digital signal having a second data rate.

16. The method of claim 15, wherein the step of modulating a control signal further comprises sigma-delta modulating the control signal.

17. The method of claim 16, further comprising the step of filtering the digital signal having the increased data rate prior to the step of decimating.

18. The method of claim 17, wherein the step of increasing the first data rate includes increasing the data rate by a fixed ratio.

19. The method of claim 18, wherein the step of decimating the digital signal having the increased data rate includes decimating the digital signal having the increased data rate by a ratio determined by the modulated output signal.

20. The method of claim 15, wherein the step of converting an analog signal to a digital signal includes the step of sigma-delta modulating a magnitude of the analog signal.

21. A method of converting an analog signal to a digital signal, comprising the steps of:

converting an analog signal to a digital signal having a first data rate;

increasing the first data rate by a fixed ratio to provide a digital signal having an increased data rate; and decimating the digital signal having the increased data rate by a variable ratio to provide a temporally noise-shaped digital signal having a second data rate.

22. The method of claim 21, wherein the step of converting an analog signal to a digital signal includes the step of sigma-delta modulating a magnitude of the analog signal.

* * * * *